(12) United States Patent
Hu et al.

(10) Patent No.: US 12,520,659 B2
(45) Date of Patent: Jan. 6, 2026

(54) DISPLAY PANEL HAVING A FIRST AUXILIARY ELECTRODE DISPOSED BETWEEN A SUBSTRATE AND A LIGHT EMITTING LAYER, MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventors: Jingyuan Hu, Guangdong (CN); Fanjing Wu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 615 days.

(21) Appl. No.: 18/070,604

(22) Filed: Nov. 29, 2022

(65) Prior Publication Data

US 2024/0130158 A1 Apr. 18, 2024

(30) Foreign Application Priority Data

Oct. 14, 2022 (CN) .......................... 202211262384.5

(51) Int. Cl.
*H10K 59/82* (2023.01)
*H10K 50/824* (2023.01)
*H10K 59/131* (2023.01)

(52) U.S. Cl.
CPC ......... *H10K 50/824* (2023.02); *H10K 59/131* (2023.02)

(58) Field of Classification Search
CPC ........................... H10K 50/824; H10K 59/131
USPC ........................................................... 257/91
See application file for complete search history.

(56) References Cited

FOREIGN PATENT DOCUMENTS

| CN | 112103326 A | * | 12/2020 | ......... H10K 59/1315 |
| CN | 114141826 A | * | 3/2022 | ......... H10K 59/1315 |

* cited by examiner

*Primary Examiner* — Phuc T Dang

(57) ABSTRACT

A display panel, a manufacturing method thereof, and a display device are provided. The display panel includes a substrate and a light emitting device layer disposed on the substrate, and the light emitting device layer includes a first electrode layer, a light emitting layer, and a second electrode layer disposed on the substrate in a stacked manner. The present application provides a first auxiliary electrode disposed between the substrate and the light emitting layer, where, the first auxiliary electrode includes a first undercut opening penetrating through the first auxiliary electrode, where a side edge of the first auxiliary electrode is exposed within the opening, the light emitting layer is disconnected at first undercut opening, the second electrode layer is disposed continuously at the first undercut opening, and at least a portion of the second electrode layer is in contact with the edge of the first auxiliary electrode.

13 Claims, 7 Drawing Sheets

DISPLAY PANEL HAVING A FIRST AUXILIARY ELECTRODE DISPOSED BETWEEN A SUBSTRATE AND A LIGHT EMITTING LAYER, MANUFACTURING METHOD THEREOF, AND DISPLAY DEVICE

CROSS-REFERENCE TO RELATED APPLICATION

This application claims the benefit of priority of Chinese Patent Application No. 202211262384.5, filed on Oct. 14, 2022, the entire content of which is hereby incorporated by reference.

TECHNICAL FIELD

The present application relates to the field of display technologies, and in particular to a display panel, a manufacturing method thereof, and a display device.

BACKGROUND

An Organic Light Emitting Diode (OLED) display panel has many advantages such as self-luminescence, low driving voltage, high luminescence efficiency, short response time, high contrast ratio, wide viewing angle, wide use temperature range, and implementation of flexible display and large-area panchromatic display, and is recognized by the industry as the display with the most development potential.

In recent years, the development of OLED has been changed rapidly. It is possible not only to manufacture curved surface displays, but also to gradually develop to large-size displays. However, in the large-size OLED, in order to increase the transmission rate of the display panel, the metal cathode is usually thinned, so that the metal cathode has large impedance, and serious current drop (IR-drop), resulting in an obvious brightness unevenness of the display panel, which seriously affects the display effect of the OLED display device.

SUMMARY

Embodiments of the present application provide a display panel, a manufacturing method thereof, and a display device to alleviate deficiencies in the related art.

To realize the above functions, technical solutions provided in the embodiments of the present application are as follows.

An embodiment of the present application provides a display panel, including:
  a substrate;
  a light emitting device layer disposed on the substrate and including a first electrode layer, a light emitting layer, and a second electrode layer disposed on the substrate in a stacked manner;
  a first auxiliary electrode disposed between the substrate and the light emitting layer;
  wherein, the first auxiliary electrode includes a first undercut opening penetrating through the first auxiliary electrode, wherein a side edge of the first auxiliary electrode is exposed within the first undercut opening, the light emitting layer is disconnected at the first undercut opening, the second electrode layer is disposed continuously at the first undercut opening, and at least a portion of the second electrode layer is in contact with the side edge of the first auxiliary electrode.

In the display panel provided in the embodiment of the present application, the second electrode layer includes a first body portion disposed on a side of the first auxiliary electrode away from the substrate, and a connection portion disposed within the first undercut opening; wherein the connection portion is in contact with the side edge of the first auxiliary electrode and connected to the first body portion at the side edge of the first auxiliary electrode.

In the display panel provided in the embodiment of the present application, the first auxiliary electrode includes a first conductive layer, a second conductive layer, and a third conductive layer disposed in a stacked manner, the second conductive layer being disposed between the first conductive layer and the third conductive layer;
  wherein the first undercut opening includes a first sub-undercut opening disposed in the first conductive layer, a second sub-undercut opening disposed in the second conductive layer, and a third sub-undercut opening disposed in the third conductive layer, wherein the first sub-undercut opening, the second sub-undercut opening, and the third sub-undercut opening are communicated with each other, and a diameter of the first sub-undercut opening and a diameter of the third sub-undercut opening are both less than a diameter of the second sub-undercut opening.

In the display panel provided in the embodiment of the present application, the light emitting layer includes a second body portion disposed between the first auxiliary electrode and the first body portion, and a branch portion disposed within the first sub-undercut opening, wherein the branch portion is disconnected from the second body portion, and an orthographic projection of the connection portion on the substrate covers an orthographic projection of the branch portion on the substrate.

In the display panel provided in the embodiment of the present application, the branch portion is disposed within the first sub-undercut opening, and a thickness of the branch portion is less than or equal to a thickness of the first conductive layer.

In the display panel provided in the embodiment of the present application, within the first undercut opening, the connection portion is in contact with a side of the first conductive layer away from the substrate, the connection portion is in contact with a side edge of the second conductive layer, and the connection portion is in contact with a side edge of the third conductive layer.

In the display panel provided in the embodiment of the present application, the first electrode layer includes a second auxiliary electrode disposed between the first auxiliary electrode and the light emitting layer, wherein the second auxiliary electrode is connected to the first auxiliary electrode and an orthographic projection of the second auxiliary electrode on the substrate covers an orthographic projection of the first auxiliary electrode on the substrate; wherein the second auxiliary electrode includes a second undercut opening disposed corresponding to the first undercut opening, wherein the second undercut opening penetrates through the second auxiliary electrode, a side edge of the second auxiliary electrode is exposed within the second undercut opening, the light emitting layer is disconnected at the second undercut opening, the second electrode layer is continuously disposed at the second undercut opening, the second undercut opening and the first undercut opening is in communication with each other, the second electrode layer is extended from the second undercut opening into the first undercut opening, and at least a portion of the second electrode layer is in contact with the side edge of the second auxiliary electrode.

In the display panel provided in the embodiment of the present application, the second auxiliary electrode includes a fourth conductive layer, a fifth conductive layer, and a sixth conductive layer disposed in a stacked manner, the fifth conductive layer being disposed between the fourth conductive layer and the sixth conductive layer;

wherein the first undercut opening includes a fourth sub-undercut opening disposed in the fourth conductive layer, a fifth sub-undercut opening disposed in the fifth conductive layer, and a sixth sub-undercut opening disposed in the sixth conductive layer, the fourth sub-undercut opening, the fifth sub-undercut opening, and the sixth sub-undercut opening being communicated with each other.

In the display panel provided in the embodiment of the present application, the first auxiliary electrode includes a first conductive layer, a second conductive layer, and a third conductive layer disposed in a stacked manner, the second conductive layer being disposed between the first conductive layer and the third conductive layer;

The first conductive layer includes a first conductive sub-portion and a first extension portion, wherein the first conductive sub-portion is connected to the second conductive layer, and an orthographic projection of the first extension portion on the substrate is not overlapped with an orthographic projection of the second conductive layer on the substrate; the third conductive layer includes a second conductive sub-portion and a second extension portion, wherein the second conductive sub-portion is connected to the second conductive layer, and an orthographic projection of the second extension portion on the substrate is not overlapped with an orthographic projection of the second conductive layer on the substrate;

wherein the first undercut opening is formed by the first extension portion, a side surface of the second conductive layer, and the second extension portion.

An embodiment of the present application provides a method for manufacturing a display panel, including:

providing a substrate;

forming a first auxiliary electrode on the substrate, and forming a first undercut opening on the first auxiliary electrode penetrating through the first auxiliary electrode, wherein a side edge of the first auxiliary electrode is exposed in the first undercut opening; and sequentially forming a first electrode layer, a light emitting layer, and a second electrode layer on a side of the first auxiliary electrode away from the substrate; wherein the light emitting layer is disconnected at the first undercut opening, the second electrode layer is disposed continuously at the first undercut opening, and at least a portion of the second electrode layer is in contact with a side edge of the first auxiliary electrode.

An embodiment of the present disclosure provides a display device including the display panel according to any one of the foregoing embodiments.

Beneficial effects of the embodiments of the present application are: to provide the first auxiliary electrode between the substrate and the light emitting layer in the embodiments of the present application, where, the first auxiliary electrode includes the first undercut opening penetrating through the first auxiliary electrode, wherein a side edge of the first auxiliary electrode is exposed within the first undercut opening, the light emitting layer is disconnected at the first undercut opening, the second electrode layer is disposed continuously at the first undercut opening, and at least a portion of the second electrode layer is in contact with the side edge of the first auxiliary electrode, thereby reducing an impedance of the second electrode layer by using the first auxiliary electrode as a parallel resistance of the second electrode layer. As a result, a voltage drop effect of the second electrode layer can be improved, which is beneficial to improve display quality of the display panel. Further, by using the first auxiliary electrode including the first undercut opening, a process step of additionally providing the undercut opening is saved.

BRIEF DESCRIPTION OF THE DRAWINGS

In order to more clearly illustrate the technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

EMBODIMENTS OF THE PRESENT DISCLOSURE

Figure 1:
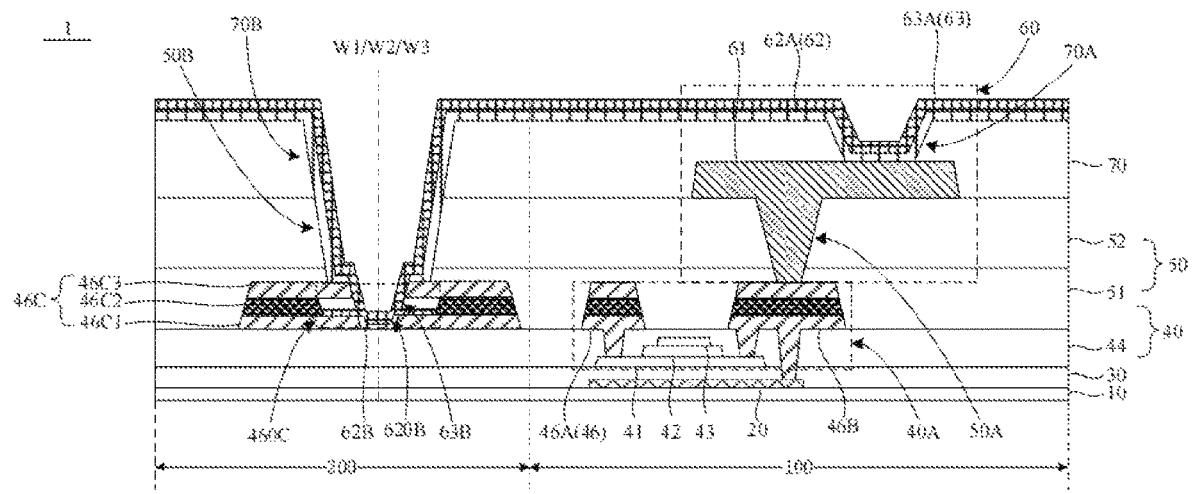
FIG. 1 is a first schematic cross-sectional diagram of a display panel according to an embodiment of the present application.

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application. In addition, it should be understood that the specific implementations described here are only used to illustrate and explain the present disclosure, and are not used to limit the present disclosure. In the present disclosure, unless otherwise stated, directional words used such as "upper" and "lower" generally refer to the upper and lower directions of the device in actual use or working state, and specifically refer to the drawing directions in the drawings; and "inner" and "outer" refer to the outline of the device.

Embodiments of the present application provide a display panel, a manufacturing method thereof, and a display device. Detailed descriptions are given below. It should be noted that the order in which the following embodiments are described is not intended to limit the preferred order of the embodiments.

Figure 2:
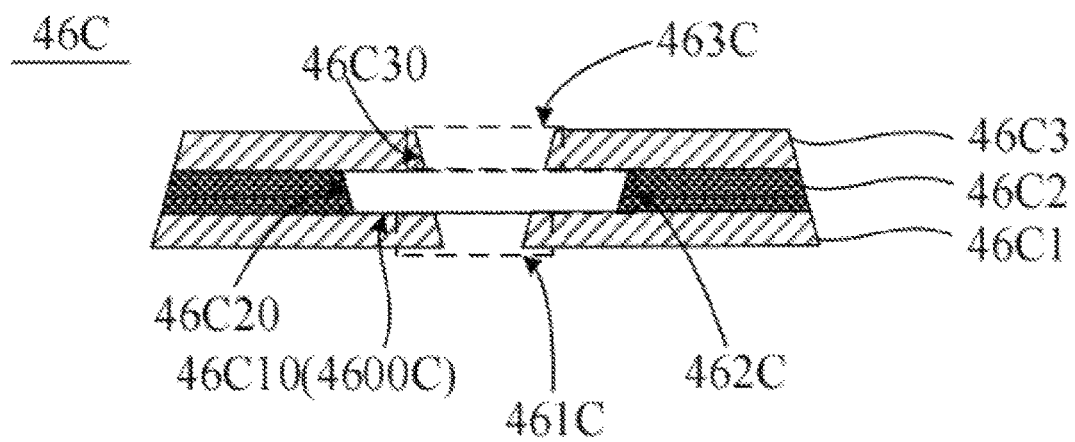
FIG. 2 is a first schematic cross-sectional diagram of a first auxiliary electrode of a display panel according to an embodiment of the present application.

Please refer to FIGS. 1 and 2, where FIG. 1 is a first schematic cross-sectional diagram of a display panel according to an embodiment of the present application; and FIG. 2 is a first schematic cross-sectional diagram of a first auxiliary electrode of a display panel according to an embodiment of the present application.

The present embodiment provides a display panel 1, including but not limited to one of an Light Emitting Diode (LED) and an Organic Light Emitting Diode (OLED), and the present embodiment is not specifically limited thereto. It should be noted that the present embodiment describes technical solutions of the present application by taking uses the OLED display panel as an example of the display panel.

In the present embodiment, the display panel 1 includes a substrate 10, a thin film transistor layer 40 disposed on the substrate 10, and a light emitting device layer 60 disposed on a side of the thin film transistor layer 40 away from the substrate 10.

Further, in the present embodiment, the display panel 1 further includes both a buffer layer 30 and a light shielding layer 20 disposed between the substrate 10 and the thin film transistor layer 40, where the buffer layer 30 is disposed on a side of the light shielding layer 20 away from the substrate 10, and an orthographic projection of the light shielding layer 20 on the substrate 10 covers at least an orthographic projection of an active layer 41 on the substrate 10. The light shielding layer 20 may shield light incident on the active layer 41, thereby reducing an increase of the leakage current caused by photogenerated carriers generated while the light irradiates the active layer 41, and further maintaining the stability of the thin film transistor 40A during operation.

The thin film transistor layer 40 includes an active layer 41, a gate insulating layer 42, a gate 43, an interlayer insulating layer 44, a source 46A, and a drain 46B on an insulating layer. Specifically, the thin film transistor layer 40 includes at least one thin film transistor 40A including the active layer 41, the gate insulating layer 42, the gate 43, the interlayer insulating layer 44, the source 46A, and the drain 46B that are disposed on the substrate 10 in a stacked manner. The source 46A and the drain 46B are disposed in the same layer and at intervals. That is, the present embodiment describes the technical solution of the present application by taking a top-gate thin film transistor as an example of the thin film transistor 40A.

The active layer 41 includes a first conductor portion (not marked in the figure) and a second conductor portion (not marked in the figure), and an active segment (not marked in the figure) disposed between the first conductor portion and the second conductor portion, the source 46A is connected to the first conductor portion, the drain 46B is connected to the second conductor portion, the drain 46B is connected to the light shielding layer 20, and an orthographic projection of the gate 43 on the substrate 10 is overlapped with an orthographic projection of the active segment on the substrate 10.

The display panel 1 further includes a first insulating layer 50 disposed between the thin film transistor layer 40 and the light emitting device layer 60, where the light emitting device layer 60 includes a first electrode layer 61, a light emitting layer 62, and a second electrode layer 63 disposed on the thin film transistor layer 40 in a stacked manner. The first insulating layer 50 is provided with a first via hole 50A for exposing a portion of the drain 46B, the light emitting layer 62 is provided on the first electrode layer 61, the second electrode layer 63 is provided on the light emitting layer 62, a first side of the first electrode layer 61 is connected to the light emitting layer 62, and a second side of the first electrode layer 61 is connected to the drain 46B through the first via hole 50A.

It should be noted that an example where the first electrode layer 61 includes an anode and the second electrode layer 63 includes a cathode is taken in the present embodiment to illustrate the technical solution of the present application. The display panel 1 further includes a pixel definition layer 70 disposed on the side of the first insulating layer 50 away from the thin film transistor layer 40, where the pixel definition layer 70 is provided with a first slot 70A for exposing the first electrode layer 61, at least a portion of the light emitting layer 62 is disposed in the first slot 70A, the light emitting layer 62 is connected to the first electrode layer 61 through the first slot 70A, at least a portion of the second electrode layer 63 is disposed in the first opening 70A, and the second electrode layer 63 is connected to the light emitting layer 62 through the first slot 70A.

Specifically, the first insulating layer 50 includes both a passivation layer 51 and a planar layer 52 disposed on the thin film transistor 40 in a stacked manner. The passivation layer 51 is provided with a first sub-hole for exposing a portion of the drain 46B (not marked in the figure), and the planar layer 52 is provided with a second sub-hole for exposing a portion of the drain 46B (not marked in the figure). The second sub-hole is communicated with the first sub-hole, a second side of the first electrode layer 61 is connected to the drain 46B through the first sub-hole and the second sub-hole, and an aperture of the second sub-hole is equal to an aperture of the first sub-hole in a direction perpendicular to the substrate 10.

In the present embodiment, the display panel 1 includes a light emitting region 100 and a non-light emitting region 200. The display panel 1 further includes a first auxiliary electrode 46C disposed between the substrate 10 and the light emitting layer 62, where the first auxiliary electrode 46C is disposed within the non-light emitting region 200, and a material of the first auxiliary electrode 46C includes, but not limited to, at least one of copper (Cu), molybdenum (Mo), titanium (Ti), nickel (Ni), and molybdenum-titanium alloy (MoTi). Specifically, the first auxiliary electrode 46C includes a first undercut opening 460C penetrating through the first auxiliary electrode 46C, where a side edge 4600C of the first auxiliary electrode 46C is exposed within the first undercut opening 460C, the light emitting layer 62 is disconnected at the first undercut opening 460C, the second electrode layer 63 is disposed continuously at the first undercut opening 460C, and at least a portion of the second electrode layer 63 is in contact with the side edge 4600C of the first auxiliary electrode 46C.

It should be understood that the present embodiment provides the first auxiliary electrode 46C including the first undercut opening 460C, so that the light emitting layer 62 is disconnected at the first undercut opening 460C, the second electrode layer 63 is disposed continuously at the first undercut opening 460C, the second electrode layer 63 is extended from the light emitting layer 62 at the disconnection of the first undercut opening 460C into the first undercut opening 460C, and at least a portion of the second electrode layer 63 is in contact with the side edge 4600C of the first auxiliary electrode 46C, thereby reducing an impedance of the second electrode layer 63 by using the first auxiliary electrode 46C as a parallel resistance of the second electrode layer 63. As a result, a voltage drop (IR Drop) effect of the second electrode layer 63 can be improved, which is beneficial to improve display quality of the display panel 1. Further, by using the first auxiliary electrode 46C including the first undercut opening 460C, a process step of additionally providing the undercut opening in the related art is saved.

In the present embodiment, the second electrode layer 63 includes a first body portion 63A disposed on a side of the first auxiliary electrode 46C away from the substrate 10, and a connection portion 63B disposed within the first undercut opening 460C. The connection portion 63B is in contact with the side edge 4600C of the first auxiliary electrode 46C, and the connection portion 63B is connected to the first body portion 63A at the side edge 4600C of the first auxiliary electrode 46C.

Specifically, the second electrode layer 63 covers the first undercut opening 460C, the first body portion 63A is extended from one side of the light emitting layer 62 away from the substrate 10 toward the first undercut opening 460C, the connection portion 63B is disposed in the side edge 4600C of the first undercut opening 460C, and the connection portion 63B is connected to the first body portion 63A at the side edge 4600C of the first auxiliary electrode 46C, thereby enabling the second electrode layer 63 to be connected to the first auxiliary electrode 46C within the first undercut opening 460C.

Further, in the present embodiment, the first auxiliary electrode 46C is disposed between the interlayer insulating layer 44 and the first insulating layer 50, the first auxiliary electrode 46C includes a first conductive layer 46C1, a second conductive layer 46C2, and a third conductive layer 46C3 disposed in a stacked manner, and the second conductive layer 46C2 is disposed between the first conductive layer 46C1 and the third conductive layer 46C3. The first undercut opening 460C includes a first sub-undercut opening 461C disposed in the first conductive layer 46C1, a second sub-undercut opening 462C disposed in the second conductive layer 46C2, and a third sub-undercut opening 463C disposed in the third conductive layer 46C3. The first sub-undercut opening 461C, the second sub-undercut opening 462C, and the third sub-undercut opening 463C are communicated with each other, the first sub-undercut opening 461C has a diameter less than that of the second sub-undercut opening 462C, and the third sub-undercut opening 463C has a diameter less than that of the second sub-undercut opening 462C, such that the film layer formed above the first auxiliary electrode 46C is disconnected at the third sub-undercut opening 463C.

In the present embodiment, the material of the first conductive layer 46C1 includes, but is not limited to, at least one of molybdenum (Mo), titanium (Ti), and molybdenum-titanium alloy (MoTi), the material of the second conductive layer 46C2 includes, but is not limited to, at least one of copper (Cu), aluminum (Al), and silver (Ag), and the material of the third conductive layer 46C3 includes, but is not limited to, at least one of molybdenum (Mo), titanium (Ti), and molybdenum-titanium alloy (MoTi). Preferably, an example where the material of the first conductive layer 46C1 is molybdenum-titanium alloy (MoTi), the material of the second conductive layer 46C2 is copper (Cu), and the material of the third conductive layer 46C3 is molybdenum-titanium alloy (MoTi) is taken in the present embodiment to illustrate the technical solution of the present application.

It should be understood that, in the present embodiment, the first conductive layer 46C1, the second conductive layer 46C2, and the third conductive layer 46C3 may be simultaneously manufactured by one photomask process, thereby making the process simpler without adding additional photomask processes. Further, by disposed the first conductive layer 46C1 between the second conductive layer 46C2 and the interlayer insulating layer 44, adhesion between the second conductive layer 46C2 and the interlayer insulating layer 44 is improved, thereby reducing the risk of separation of the first auxiliary electrode 46C from the interlayer insulating layer 44. Further, by providing the third conductive layer 46C3 disposed on the side of the second conductive layer 46C2 away from the first conductive layer 46C1, protection of the second conductive layer 46C2 is formed, thereby reducing the risk of oxidation of the second conductive layer 46C2 in a subsequent thermal process.

It should be noted that, in the present embodiment, the first undercut opening 460C may be formed by wet etching the first conductive layer 46C1, the second conductive layer 46C2, and the third conductive layer 46C3. Since the material of the first conductive layer 46C1 is different from the material of the second conductive layer 46C2 and the same as the material of the third conductive layer 46C3, the etching rate of the first conductive layer 46C1 is the same as the etching rate of the third conductive layer 46C3, and significantly different from the etching rate of the second conductive layer 46C2 while wet etching is performed simultaneously for the first conductive layer 46C1, the second conductive layer 46C2, and the third conductive layer 46C3.

Specifically, the reactivity of the material of the first conductive layer 46C1 is weaker than that of the material of the second conductive layer 46C2, and the reactivity of the material of the third conductive layer 46C3 is weaker than that of the material of the second conductive layer 46C2, so that the etching rate of the second conductive layer 46C2 is greater than the etching rate of the first conductive layer 46C1, and the etching rate of the second conductive layer 46C2 is greater than the etching rate of the third conductive layer 46C3, thereby forming the first sub-undercut opening 461C, the second sub-undercut opening 462C, and the third sub-undercut opening 463C having different opening diameters.

Further, the first insulating layer 50 is further provided with a first via hole 50B, where the first via hole 50B exposes at least a portion of the first auxiliary electrode 46C. The pixel definition layer 70 includes a second via hole 70B, where the second via hole 70B is communicated with the first via hole 50B. Preferably, the center line W2 of the second via hole 70B, the center line W3 of the first via hole 50B, and the center line W1 of the first undercut opening 460C are overlapped with each other, the second electrode layer 63 is extended through both the second via hole 70B and the first via hole 50B into the first undercut opening 460C, and at least a portion of the second electrode layer 63 is in contact with the side edge 4600C of the first auxiliary electrode 46C.

Further, the passivation layer 51 is provided with a third sub-hole for exposing the first undercut opening 460C (not marked in the figure), and the planar layer 52 is provided with a fourth sub-hole for exposing the first undercut opening 460C (not marked in the figure). The fourth sub-hole is communicated with the third sub-hole, the aperture of the fourth sub-hole is equal to the aperture of the third sub-hole, the second electrode The layer 63 is extended through the second via hole 70B, the fourth sub-hole and the third sub-hole into the first undercut opening 460C, and the connection portion 63B is in contact with the side edge 4600C of the first auxiliary electrode 46C.

It should be noted that, in the present embodiment, the second electrode layer 63 may be manufactured by Sputter or the like, so that the second electrode layer 63 may be a continuous film layer on the light emitting layer 62, thereby enabling the second electrode layer 63 to be lapped to the first auxiliary electrode 46C at the inner wall of the first undercut opening 460C. It should be noted that, in another embodiment, the second electrode layer 63 may be a continuous film layer on the light emitting layer 62 by adjusting an evaporation angle, so that the second electrode layer 63 is lapped to the first auxiliary electrode 46C at the inner wall of the first undercut opening 460C.

In the present embodiment, the orthographic projection of the second electrode layer 63 on the substrate 10 covers the orthographic projection of the light emitting layer 62 on the substrate 10. The light emitting layer 62 includes a second body portion 62A disposed between the first auxiliary electrode 46C and the first body portion 63A, and a branch portion 62B disposed within the first sub-undercut opening 461C, where the branch portion 62B is disconnected from the second body portion 62A, and the orthographic projection of the connection portion 63B on the substrate 10 covers the orthographic projection of the branch portion 62B on the substrate 10.

Specifically, the branch portion 62B is disposed within the first sub-undercut opening 461C, and the thickness of the branch portion 62B is less than or equal to the thickness of the first conductive layer 46C1. Preferably, in the embodiment, the thickness of the branch portion 62B is equal to the thickness of the first conductive layer 46C1, and the branch portion 62B covers the bottom and inner wall of the first sub-undercut opening 461C. Within the first undercut opening 460C, the connection portion 63B is in contact with the side 46C10 of the first conductive layer 46C1 away from the substrate 10, the connection portion 63B is in contact with the side 46C20 of the second conductive layer 46C2, and the connection portion 63B is in contact with the side 46C30 of the third conductive layer 46C3.

Further, the side of the branch portion 62B away from the bottom of the first sub-undercut opening 461C includes a first groove 620B, the connection portion 63B is disposed on the side of the branch portion 62B away from the substrate 10, and the connection portion 63B covers the branch portion 62B is extended from the first groove 620B toward the direction close to the first body portion 63A. It should be understood that the present embodiment may increase a contact area between the connection portion 63B and the first auxiliary electrode 46C by disconnected the branch portion 62B from the second body portion 62A, where the branch portion 62B is disposed within the first undercut opening 460C, and the connection portion 63B is disposed the side of the branch portion 62B away from the substrate 10. As a result, the resistance of the second electrode layer 63 is further reduced, thereby improving the voltage drop effect (IR Drop) of the second electrode layer 63.

It should be noted that, in the embodiment, the thickness of the branch portion 62B is less than or equal to the thickness of the first conductive layer 46C1, to prevent the contact area between the connection portion 63B and the first auxiliary electrode 46C from being too small, thereby affecting the connection effect between the second electrode layer 63 and the first auxiliary electrode 46C.

It should be noted that, in the embodiment, the material of the source 46A and the material of the drain 46B include, but are not limited to, at least one of copper (Cu), molybdenum (Mo), titanium (Ti) and molybdenum-titanium alloy (MoTi) or a laminate thereof. Preferably, an example where the source 46A includes a molybdenum-titanium alloy, copper, and a molybdenum-titanium alloy disposed on the substrate 10 in a stacked manner, and the drain 46B includes a molybdenum-titanium alloy, copper, and molybdenum-titanium alloys disposed on the substrate 10 in a stacked manner is taken in the present embodiment to illustrate the technical solution of the present application. That is, in the present embodiment, the display panel 1 includes a first metal layer 46, where the first metal layer 46 includes the first auxiliary electrode 46C, the source 46A and the drain 46B disposed at intervals. The embodiment simplifies the manufacturing process by disposing the first auxiliary electrode 46C, the source 46A and the drain 46B in the same layer.

Figure 3:
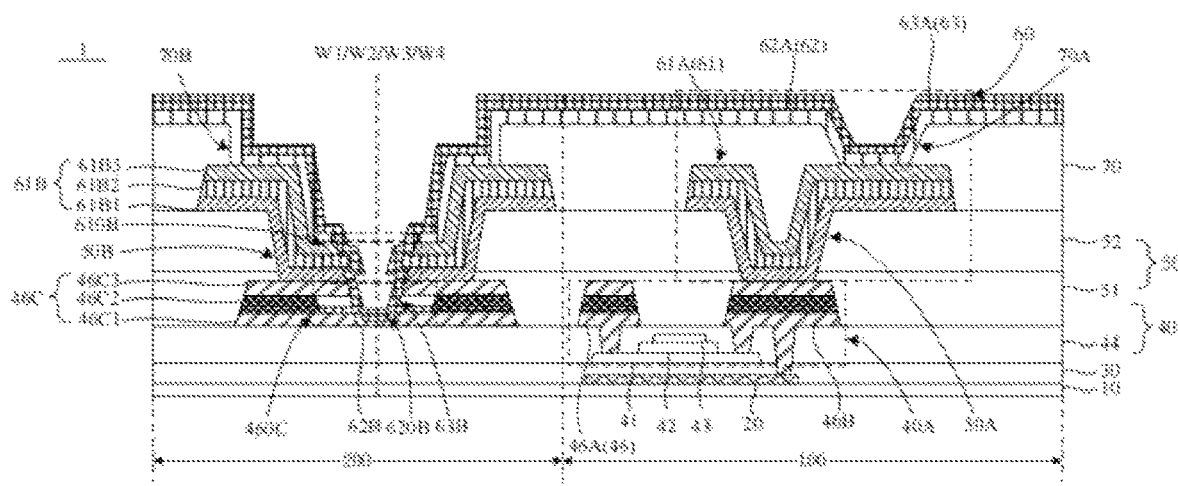
FIG. 3 is a second schematic cross-sectional diagram of a display panel according to an embodiment of the present application.
Figure 4:
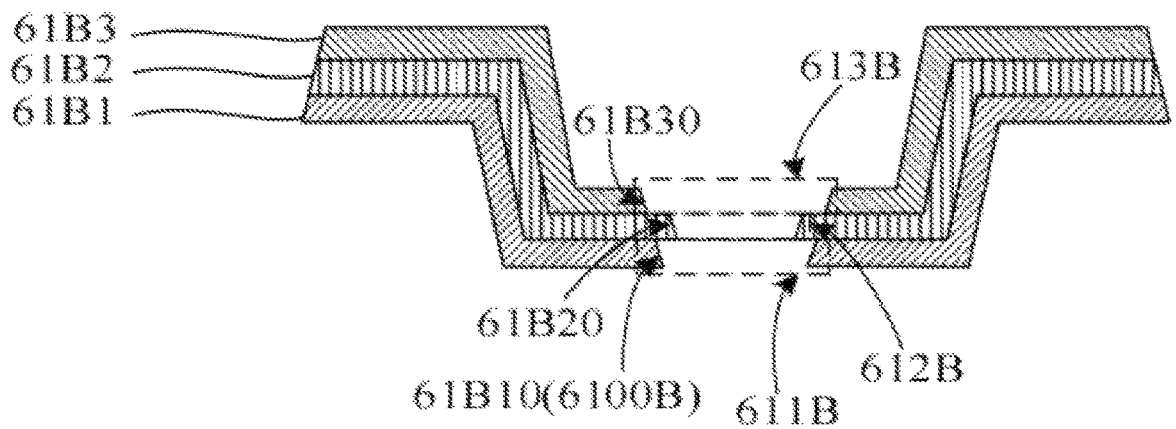
FIG. 4 is a schematic cross-sectional diagram of a second auxiliary electrode of a display panel according to an embodiment of the present application.

Please refer to FIGS. 2-4, where FIG. 3 is a second schematic cross-sectional diagram of a display panel according to an embodiment of the present application; and FIG. 4 is a schematic cross-sectional diagram of a second auxiliary electrode of a display panel according to an embodiment of the present application.

In the present embodiment, the structure of the display panel is similar/same as the first structure of the display panel provided by the above-mentioned embodiment. Please refer to the description of the display panel in the above-mentioned embodiment for details, which will not be repeatedly described herein. The difference between the two embodiments is only that:

In the present embodiment, the first electrode layer 61 includes a first sub-electrode 61A and a second auxiliary electrode 61B, where the first sub-electrode 61A is disposed in the light emitting region 100, and the light emitting layer 62 is disposed on the first sub-electrode 61A, the second auxiliary electrode 61B is disposed in the non-light emitting region 100, the second auxiliary electrode 61B is disposed on the light emitting layer 62, one end of the first sub-electrode 61A is connected to the light emitting layer 62, and the other end of the first sub-electrode 61A is connected to the drain 46B through the first via hole 50A.

It should be noted that an example where the first sub-electrode layer 61A includes an anode and the second electrode layer 63 includes a cathode is taken in the present embodiment to illustrate the technical solution of the present application. The first slot 70A of the pixel definition layer 70 is configured to expose the first sub-electrode layer 61A, at least a portion of the light emitting layer 62 is disposed in the first slot 70A, the light emitting layer 62 is connected to the first sub-electrode layer 61A through the first slot 70A, and the second via hole 70B of the pixel definition layer 70 is configured to expose a portion of the second auxiliary electrode 61B.

The second auxiliary electrode 61B is disposed between the first auxiliary electrode 46C and the light emitting layer 62 and connected to the first auxiliary electrode 46C, and the orthographic projection of the second auxiliary electrode 61B on the substrate 10 covers the orthographic projection of the first auxiliary electrode 46C on the substrate 10. The second auxiliary electrode 61B includes a second undercut opening 610B disposed corresponding to the first undercut opening 460C, where the second undercut opening 610B penetrates through the second auxiliary electrode 61B, a side edge 6100B of the second auxiliary electrode 61B is exposed within the second undercut opening 610B, the light emitting layer 62 is disconnected at the second undercut opening 610B, the second electrode layer 63 is continuously disposed at the second undercut opening 610B, the second undercut opening 610B and the first undercut opening 460C is in communication with each other, the second electrode layer 63 is extended from the second undercut opening 610B into the first undercut opening 460C, and at least a portion of the second electrode layer 63 is in contact with the side edge 6100B of the second auxiliary electrode 61B.

It should be understood that, in the present embodiment, the second auxiliary electrode 61B is connected to the first auxiliary electrode 46C, the orthographic projection of the second auxiliary electrode 61B on the substrate 10 covers the orthographic projection of the first auxiliary electrode 46C on the substrate 10, and the second auxiliary electrode 61B includes the second undercut opening 610B disposed corresponding to the first undercut opening 460C, so that the light emitting layer 62 is disconnected at the second undercut opening 610B, the second electrode layer 63 is extended from the second undercut opening 610B into the first undercut opening 460C, and at least a portion of the second electrode layer 63 is in contact with the side edge 6100B of the second auxiliary electrode 61B. The impedance of the second electrode layer 63 is reduced by the parallel connection of the second auxiliary electrode 61B, the first auxiliary electrode 46C, and the second electrode layer 63, thereby further improving the voltage drop (IR Drop) effect of the second electrode layer 63, which is beneficial to improve the display quality of the display panel 1. Further, by using the first electrode layer 61 including the second auxiliary electrode 61B having the second undercut opening 610B, the process step is saved.

Specifically, in the present embodiment, the second auxiliary electrode 61B includes a fourth conductive layer 61B1, a fifth conductive layer 61B2, and a sixth conductive layer 61B3 disposed in a stacked manner, where the fifth conductive layer 61B2 is disposed between the fourth conductive layer 61B1 and the sixth conductive layer 61B3. The second undercut opening 610B includes a fourth sub-undercut opening 611B disposed in the fourth conductive layer 61B1, a fifth sub-undercut opening 612B disposed in the fifth conductive layer 61B2, and a sixth sub-undercut opening 613B disposed in the sixth conductive layer 61B3. The fourth sub-undercut opening 611B, the fifth sub-undercut opening 612B, and the sixth sub-undercut opening 613B are communicated with each other. Further, the fourth sub-undercut opening 611B has a diameter less than that of the fifth sub-undercut opening 612B, and the sixth sub-undercut opening 613B has a diameter less than that of the fifth sub-undercut opening 612B, such that the film layer formed above the second auxiliary electrode 61B is disconnected at the sixth sub-undercut opening 613B.

Preferably, an example where the material of the fourth conductive layer 61B1 is indium tin oxide (ITO), the material of the fifth conductive layer 61B2 is silver (Ag), and the material of the sixth conductive layer 61B3 is indium tin oxide (ITO) is taken in the present embodiment to illustrate the technical solution of the present application.

It should be noted that, in the present embodiment, the second undercut opening 610B may be formed by wet etching the fourth conductive layer 61B1, the fifth conductive layer 61B2, and the sixth conductive layer 61B3. Since the material of the fourth conductive layer 61B1 is different from the material of the fifth conductive layer 61B2 and the same as the material of the sixth conductive layer 61B3, the etching rate of the fourth conductive layer 61B1 is the same as the etching rate of the sixth conductive layer 61B3 and significantly different from the etching rate of the fifth conductive layer 61B2 while wet etching is performed simultaneously for the fourth conductive layer 61B1, the fifth conductive layer 61B2, and the sixth conductive layer 61B3.

Specifically, the reactivity of the material of the fourth conductive layer 61B1 is weaker than that of the material of the fifth conductive layer 61B2, and the reactivity of the material of the sixth conductive layer 61B3 is weaker than that of the material of the fifth conductive layer 61B2, so that the etching rate of the fourth conductive layer 61B1 is greater than the etching rate of the fifth conductive layer 61B2, and the etching rate of the sixth conductive layer 61B3 is greater than the etching rate of the fifth conductive layer 61B2 thereby forming the fourth sub-undercut opening 611B, the fifth sub-undercut opening 612B, and the sixth sub-undercut opening 613B having different opening diameters.

Further, the center line W2 of the second via hole 70B, the center line W3 of the first via hole 50B, the center line W4 of the second undercut opening 610B, and the center line W1 overlap of the first undercut opening 460C are overlapped with each other. Within the second undercut opening 610B, the first body portion 63A is in contact with the side edge 61B30 of the sixth sub-undercut opening 613B, the first body portion 63A is in contact with the side edge 61B20 of the five sub-undercut openings 612B, and the first body portion 63A is in contact with the side edge 61B10 of the fourth sub-undercut opening 611B. Within the first undercut opening 460C, the connection portion 63B is in contact with the side 46C10 of the first conductive layer 46C1 away from the substrate 10, the connection portion 63B is in contact with the side 46C20 of the second conductive layer 46C2, and the connection portion 63B is in contact with the side edge 46C30 of the third conductive layer 46C3. As a result, the contact area between the connection portion 63B and the first auxiliary electrode 46C is increased, and the contact area between the first body portion 63A and the second auxiliary electrode 61B is also increased, thereby further reducing the impedance of the second electrode layer 63, and improving the voltage drop (IR Drop) effect of the second electrode layer 63.

Figure 5:
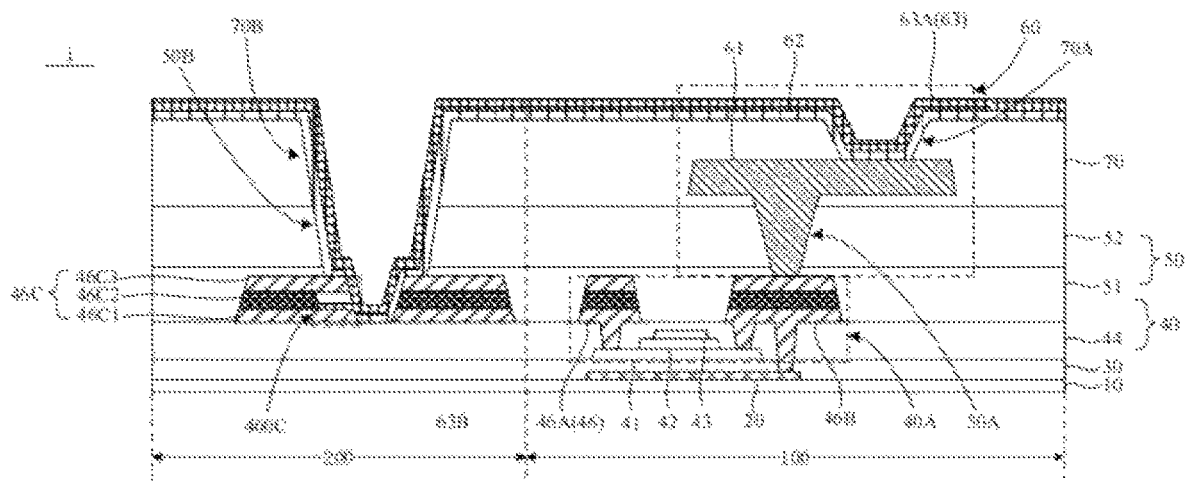
FIG. 5 is a third schematic cross-sectional diagram of a display panel according to an embodiment of the present application.
Figure 6:
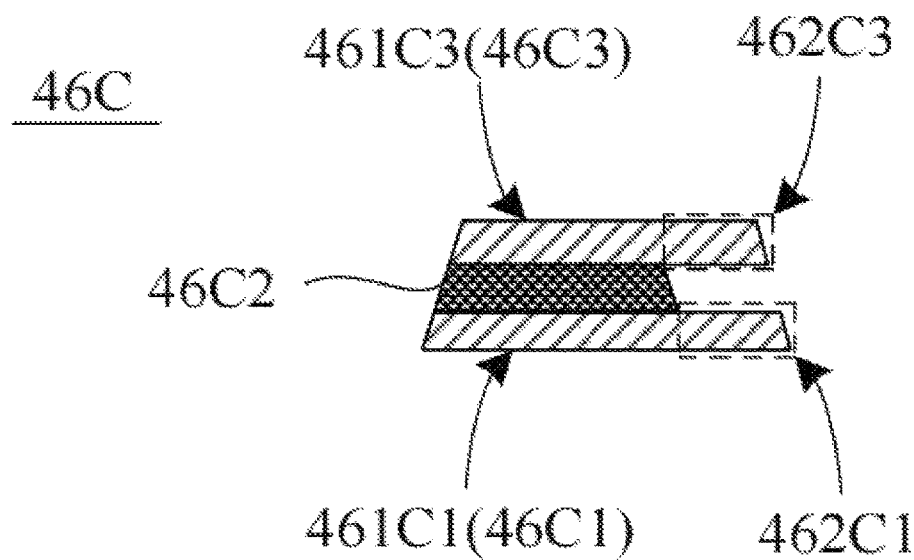
FIG. 6 is a second schematic cross-sectional diagram of a first auxiliary electrode of a display panel according to an embodiment of the present application.

Please refer to FIGS. 5 and 6, where FIG. 5 is a third schematic cross-sectional diagram of a display panel according to an embodiment of the present application; and FIG. 6 is a second schematic cross-sectional diagram of a first auxiliary electrode of a display panel according to an embodiment of the present application.

In the present embodiment, the structure of the display panel is similar/same as the first structure of the display panel provided by the above-mentioned embodiment. Please refer to the description of the display panel in the above-mentioned embodiment for details, which will not be repeatedly described herein. The difference between the two embodiments is only that:

in the present embodiment, the first auxiliary electrode 46C includes a first conductive layer 46C1, a second conductive layer 46C2, and a third conductive layer 46C3. The second conductive layer 46C2 is disposed between the first conductive layer 46C1 and the third conductive layer 46C3. The first conductive layer 46C1 includes a first conductive sub-portion 461C1 and a first extension portion 462C1, where the first conductive sub-portion 461C1 is connected to the second conductive layer 46C2, and an orthographic projection of the first extension portion 462C1 on the substrate 10 is not overlapped with an orthographic projection of the second conductive layer 46C2 on the substrate 10. The third conductive layer 46C3 includes a second conductive sub-portion 461C3 and a second extension portion 462C3, where the second conductive sub-portion 461C3 is connected to the second conductive layer 46C2, and an orthographic projection of the second extension portion 462C3 on the substrate 10 is not overlapped with an orthographic projection of the second conductive layer 46C2 on the substrate 10. The first undercut opening 460C is formed by the first extension portion 462C1, a lateral surface of the second conductive layer 46C2, and the second extension portion 462C3.

It should be noted that, in the present embodiment, the light emitting layer 62 is disconnected at the first undercut opening 460C, and the thickness of the light emitting layer 62 is less than or equal to the thickness of the first conductive layer 46C1. Preferably, an example where the thickness of the light emitting layer 62 is less than the thickness of the first conductive layer 46C1 is taken in the present embodiment to illustrate the technical solution of the present application.

Specifically, the orthographic projection of the first conductive sub-portion 461C1 on the substrate 10 is overlapped with the orthographic projection of the second conductive layer 46C2 on the substrate 10, and the third conductive layer 46C3 includes a second conductive sub-portion 461C3 and a second extension portion 462C3, where the orthographic projection of the second conductive sub-portion 461C3 on the substrate 10 is overlapped with the orthographic projection of the second conductive layer 46C2 on the substrate 10. Within the first undercut opening 460C, the second electrode layer 63 is connected to the sidewall of the first extension portion 462C1, and the second electrode layer 63 is connected to the side of the first extension portion 462C1 are away from the substrate 10, the second electrode layer 63 is connected to the second conductive layer 46C2, and the second conductive layer 46C2 is connected to the sidewall of the second extension portion 462C3, thereby reducing an impedance of the second electrode layer 63 by using the first auxiliary electrode 46C as a parallel resistance of the second electrode layer 63. As a result, a voltage drop (IR Drop) effect of the second electrode layer 63 can be improved, which is beneficial to improve display quality of the display panel 1. Further, by using the first auxiliary electrode 46C including the first undercut opening 460C, a process step of additionally providing the undercut opening is saved.

Figure 7:
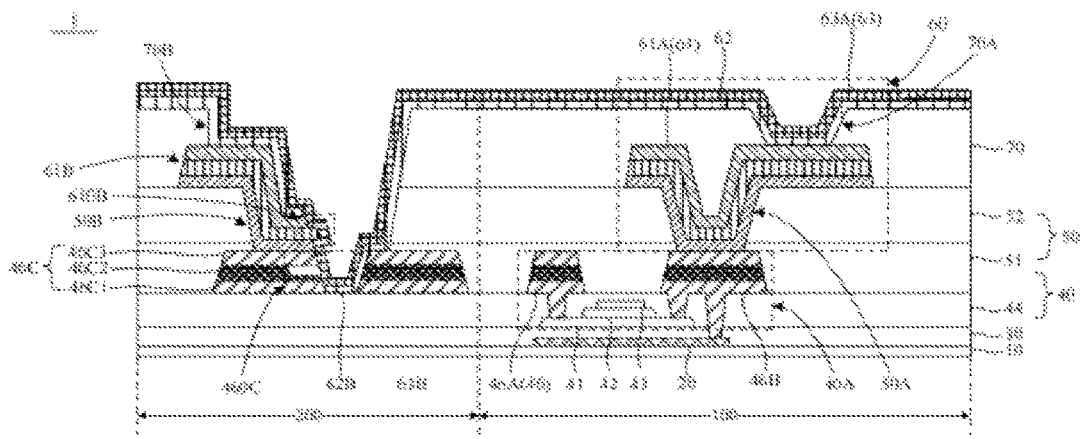
FIG. 7 is a fourth schematic cross-sectional diagram of a display panel according to an embodiment of the present application.

It should be noted in another embodiment that FIG. 7 is a fourth schematic cross-sectional diagram of a display panel according to an embodiment of the present application.

The first electrode layer 61 includes a second auxiliary electrode 61B disposed in the non-light emitting region 200, where the second auxiliary electrode 61B is disposed between the first auxiliary electrode 46C and the light emitting layer 62 and connected to the first auxiliary electrode 46C, and the orthographic projection of the second auxiliary electrode 61B on the substrate 10 covers the orthographic projection of the first auxiliary electrode 46C on the substrate 10.

The second auxiliary electrode 61B includes a second undercut opening 610B disposed corresponding to the first undercut opening 460C, where the via hole 620, the second undercut opening 610B and the first undercut opening 610B 460C are communicated with each other. The second electrode layer 63 is extended from the via hole 620 into the second undercut opening 610B and connected to the second auxiliary electrode 61B. The second electrode layer 63 is extended from the second undercut opening 610B into the first undercut opening 460C and connected to the first auxiliary electrode 46C. An impedance of the second electrode layer 63 is reduced by parallel connection of the second auxiliary electrode 61B, the first auxiliary electrode 46C, and the second auxiliary electrode 46C. As a result, a voltage drop (IR Drop) effect of the second electrode layer 63 can be improved, which is beneficial to improve display quality of the display panel 1. Further, by using the first electrode layer 61 including the second auxiliary electrode 61B having the second undercut opening 610B, the process step is saved.

Figure 8:
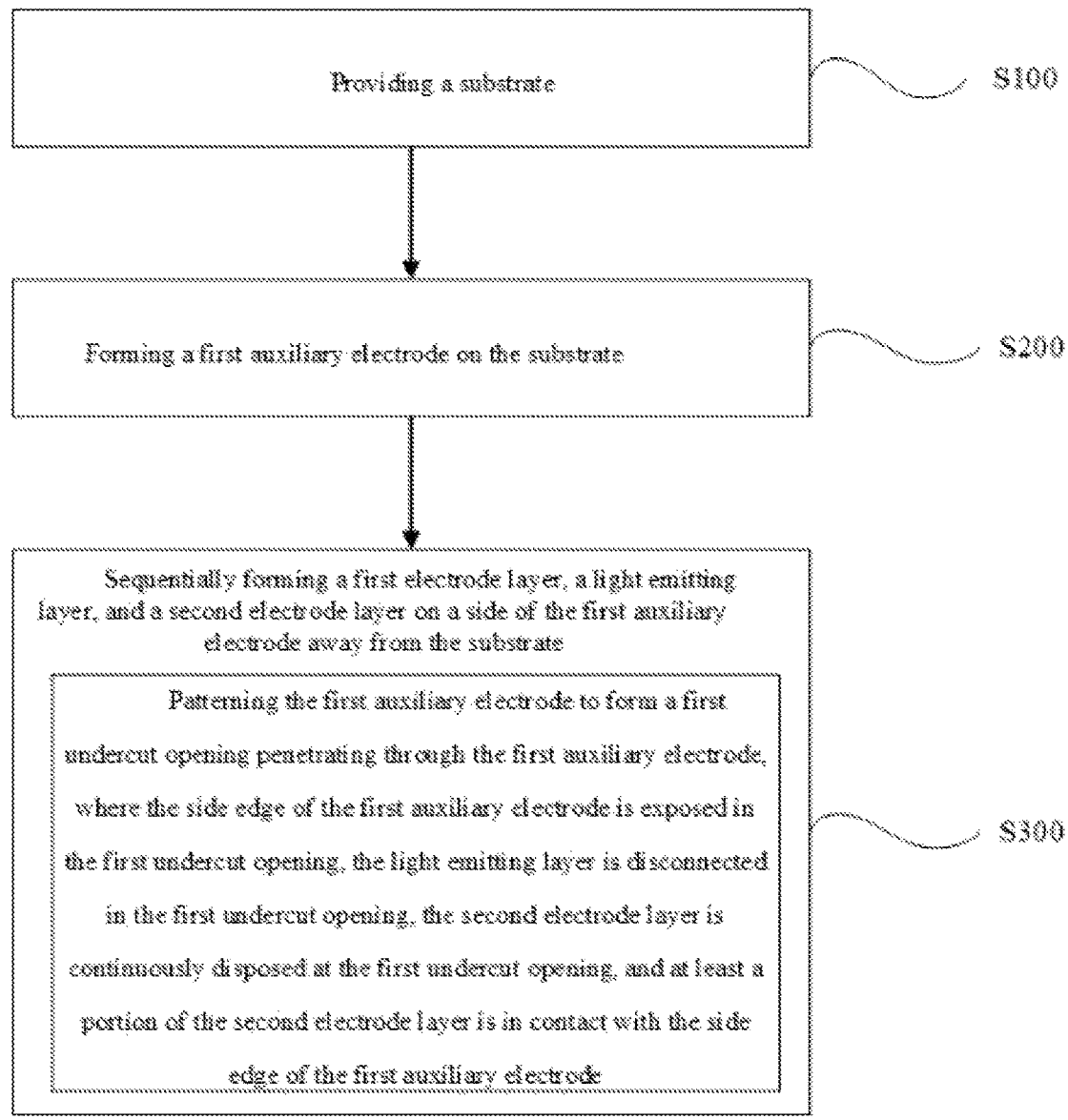
FIG. 8 is a flowchart of a manufacturing method of a display panel according to an embodiment of the present disclosure.

An embodiment of the present application also provides a manufacturing method of a display panel. Please refer to FIGS. 2-4, 8, and 9A to 9G, wherein, FIG. 8 is a flowchart of the manufacturing method of the display panel provided by the embodiment of the present application; and FIGS. 9A to 9G are flow charts of a structural process for manufacturing the display panel in FIG. 8.

In the present embodiment, the manufacturing method of the display panel 1 includes the following steps S100-S600.

Step S100: providing a substrate 10.

When the substrate 10 is a rigid substrate, the material of the substrate can be metal or glass. When the substrate 10 is a flexible substrate, the material of the substrate can include at least one of an acrylic resin, a methacrylic resin, a polyisoprene, a vinyl resin, an epoxy-based resin, a urethane-based resin, a cellulose resin, a siloxane resin, a polyimide-based resin, and a polyamide-based resin, Specifically, the step S100 further includes sequentially forming a light shielding layer 20 and a buffer layer 30 on the substrate 10. The material of the light shielding layer 20 includes, but is not limited to, one of molybdenum (Mo), titanium (Ti), and nickel (Ni) or their alloys. The material of the buffer layer 30 includes, but is not limited to, single-layer silicon nitride (Si3N4), single-layer silicon dioxide (SiO2), single-layer silicon oxynitride (SiONx), or a double-layer structure of the above film layers.

Step S200: forming a first auxiliary electrode 46C on the substrate 10.

Figure 9A:
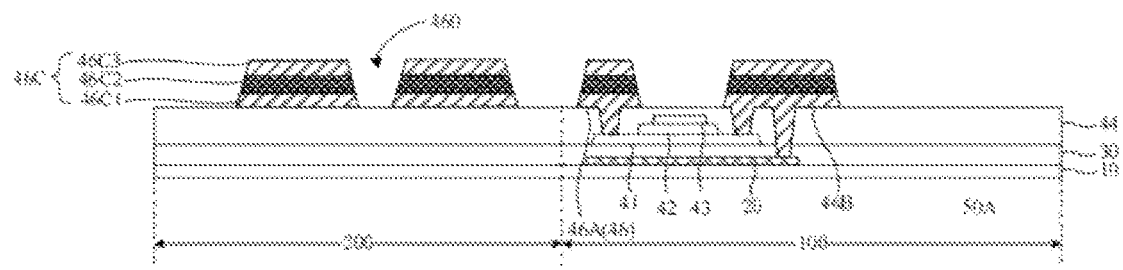
FIG. 9A is a flowchart of a structural process for manufacturing the display panel in FIG. 8.

Specifically, the step S200 includes sequentially forming an active layer 41, a gate insulating layer 42, a gate 43, an interlayer insulating layer 44, and a first metal layer 46 on the side of the buffer layer 30 away from the light shielding layer 20, as shown in FIG. 9A.

The first metal layer 46 includes a first conductive layer 46C1, a second conductive layer 46C2, and a third conductive layer 46C3 disposed on the substrate 10 in a stacked manner. An example where the material of the first conductive layer 46C1 is molybdenum-titanium alloy (MoTi), the material of the second conductive layer 46C2 is copper (Cu), and the material of the third conductive layer 46C3 is molybdenum-titanium alloy (MoTi) is taken in the present embodiment to illustrate the technical solution of the present application.

Specifically, the first metal layer 46 includes the first auxiliary electrode 46C, a source 46A, and a drain 46B disposed at intervals, where the source 46A and the drain 46B are disposed in the light emitting region 100, and the first auxiliary electrode 46A is disposed in the non-light emitting region 200 and provided with a second groove 460 penetrating through the first auxiliary electrode 46C. The active layer 41 includes a first conductor portion (not marked in the figure) and a second conductor portion (not marked in the figure), and an active segment (not marked in the figure) disposed between the first conductor portion and the second conductor portion, the source 46A is connected to the first conductor portion, the drain 46B is connected to the second conductor portion, the drain 46B is connected to the light shielding layer 20, and an orthographic projection of the gate 43 on the substrate 10 is overlapped with an orthographic projection of the active segment on the substrate 10.

Figure 9B:
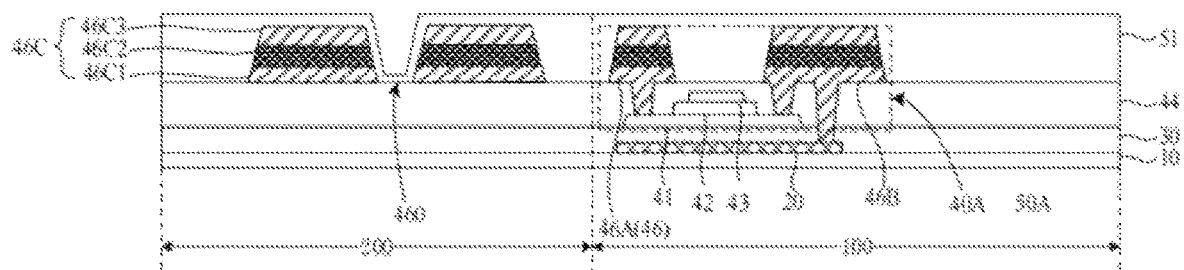
FIG. 9B is a flowchart of a structural process for manufacturing the display panel in FIG. 8.

Step S300: forming a passivation layer 51 on the side of the first auxiliary electrode 46C away from the substrate 10, as shown in FIG. 9B. The passivation layer 51 covers the first metal layer 46, thereby serving as a barrier to water and oxygen and insulation for the first auxiliary electrode 46C, the source 46A, and the drain 46B.

Figure 9C:
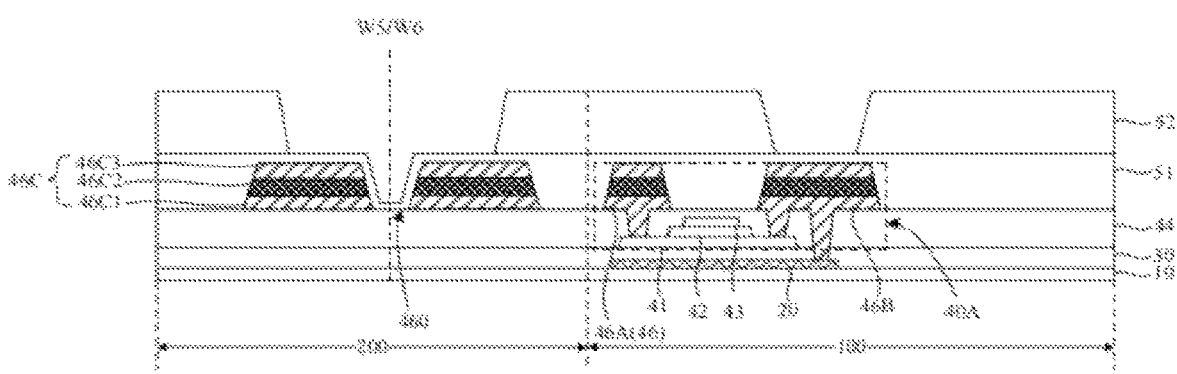
FIG. 9C is a flowchart of a structural process for manufacturing the display panel in FIG. 8.

Step S400: forming a planar layer 52 on the side of the passivation layer 51 away from the first auxiliary electrode 46C, and patterning the planar layer 52 to form a first sub-hole disposed on the drain 46B (not marked in the figure), and a third sub-hole disposed on the first auxiliary electrode 46C (not marked in the figure). The first sub-hole and the third sub-hole both penetrate through the planar layer 52, as shown in FIG. 9C. The center line W6 of the third sub-hole is overlapped with the center line W5 of the second groove 460.

Figure 9D:
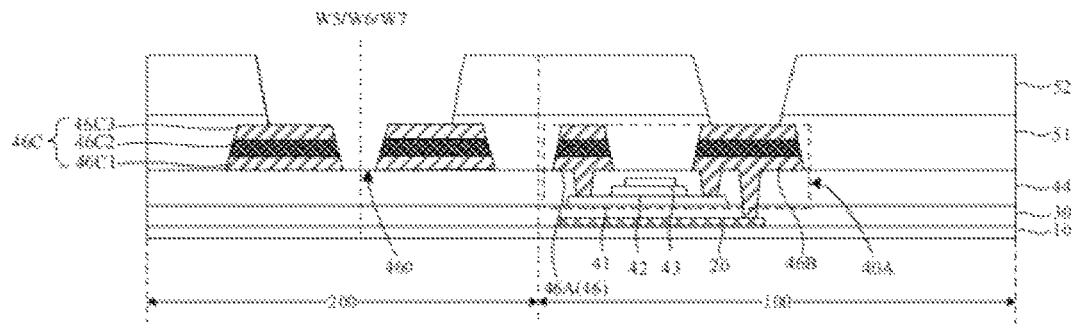
FIG. 9D is a flowchart of a structural process for manufacturing the display panel in FIG. 8.

Step S500: patterning the passivation layer 51 to form a second sub-hole for exposing a portion of the drain 46B (not marked in the figure) and a fourth sub-hole for exposing a portion of the first auxiliary electrode 46C (not marked in the figure), where the second sub-hole and the fourth sub-hole both penetrate through the planar layer 52, as shown in FIG. 9D.

The second sub-hole is communicated with the first sub-hole, the center line of the second sub-hole is overlapped with the center line of the first sub-hole, the fourth sub-hole is communicated with the third sub-hole, the center line W7 of the fourth sub-hole, the center line W6 of the third sub-hole, and the center line W5 of the second groove 460 are overlapped with each other, the aperture of the fourth sub-hole is equal to that of the third sub-hole, and the aperture of the third sub-hole is greater than the width of the second groove 460.

Step S600: forming a first electrode layer 61 on the side of the passivation layer 51 away from the planar layer 52, where the first electrode layer 61 includes a second auxiliary electrode 61B disposed in the non-light emitting region 200 and a first sub-electrode 61A disposed in the light emitting region 100, the second auxiliary electrode 61B penetrates through the fourth sub-hole and the third sub-hole to be connected to the first auxiliary electrode 46C, and the first electrode layer 61 penetrates through the first sub-hole and the second sub-hole to be connected to the drain 46B.

The first electrode layer 61 includes a fourth conductive layer 61B1, a fifth conductive layer 61B2, and a sixth conductive layer 61B3 disposed on the substrate 10 in a stacked manner. An example where the material of the fourth conductive layer 61B1 is indium tin oxide (ITO), the material of the fifth conductive layer 61B2 is silver (Ag), and the material of the sixth conductive layer 61B3 is indium tin oxide (ITO) is taken in the present embodiment to illustrate the technical solution of the present application.

Specifically, the step S600 further includes patterning the second auxiliary electrode 61B and the first auxiliary electrode 46C to form a second undercut opening 610B penetrating through the second auxiliary electrode 61B, and a first undercut opening 460C penetrating through the first auxiliary electrode 46C, where the side edge 4600C of the first auxiliary electrode 46C is exposed in the first undercut opening 460C, the light emitting layer 62 is disconnected in the second undercut opening 610B, the second electrode layer 63 is continuously disposed at the second undercut opening 610B, and at least a portion of the second electrode layer 63 is in contact with the side edge 4600C of the first auxiliary electrode 46C.

Figure 9E:
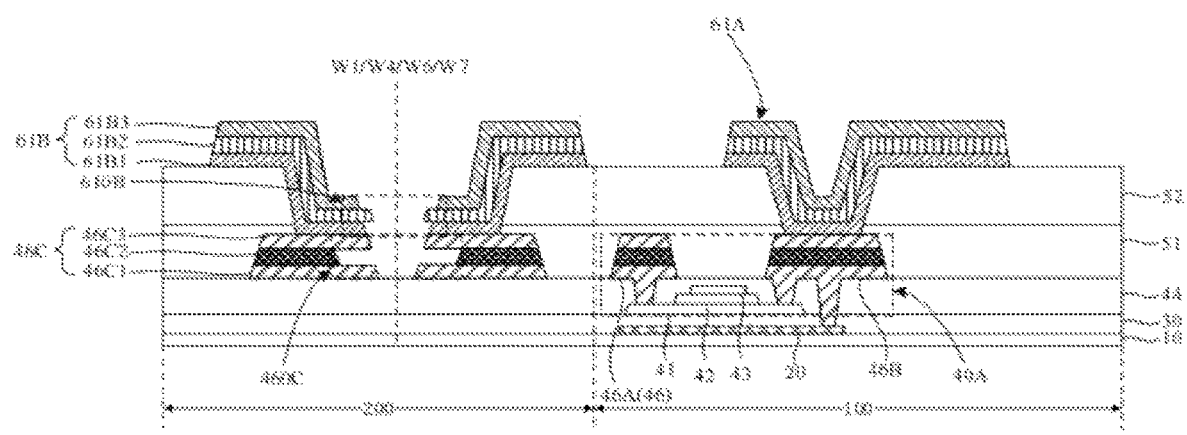
FIG. 9E is a flowchart of a structural process for manufacturing the display panel in FIG. 8.

Specifically, in the step S600, an etchant may be used to etch the second auxiliary electrode 61B and the first auxiliary electrode 46C to form a pattern, thereby forming the second undercut opening 610B on the second auxiliary electrode 61B and forming the first undercut opening 460C on the first auxiliary electrode 46C. The center line W4 of the second undercut opening 610B, the center line W7 of the fourth sub-hole, the center line W6 of the third sub-hole, and the center line W1 of the first undercut opening 460C are overlapped with each other, as shown in FIG. 9E.

An etching speed of the etchant to the sixth conductive layer 61B3 is greater than to an etching speed of the etchant to the fifth conductive layer 61B2, and the etching speed of the etchant to the fifth conductive layer 61B2 is less than an etching speed of the etchant to the fourth conductive layer 61B1, so that a fourth sub-undercut opening 611B is formed in the fourth conductive layer 61B1, a fifth sub-undercut opening 612B is formed in the fifth conductive layer 61B2, and a sixth sub-undercut opening 613B is formed in the sixth conductive layer 61B3. The fourth sub-undercut opening 611B, the fifth sub-undercut opening 612B, and the sixth sub-undercut opening 613B are communicated with each other. The fourth sub-undercut opening 611B has a diameter less than that of the fifth sub-undercut opening 612B, and the sixth sub-undercut opening 613B has a diameter less than that of the fifth sub-undercut opening 612B, thereby disconnecting the film layer formed therein at the inner wall.

An etching speed of the etchant to the third conductive layer 46C3 is less than ab etching speed of the etchant to the second conductive layer 46C2, and the etching speed of the etchant to the second conductive layer 46C2 is greater than an etching speed of the etchant to the first conductive layer 46C1, so that a first sub-undercut opening 461C is formed in the first conductive layer 46C1, a second sub-undercut opening 462C is formed in the second conductive layer 46C2, and a third sub-undercut opening 463C is formed in the first sub-undercut opening 461C. The first sub-undercut opening 461C, the second sub-undercut opening 462C, and the third sub-undercut 463C are communicated with each other. The first sub-undercut opening 461C has a diameter less than that of the second sub-undercut opening 462C, and the third sub-undercut opening 463C has a diameter less than that of the second sub-undercut opening 462C, such that the film layer formed above the first sub-undercut opening 461C is disconnected at the first sub-undercut opening 461C. The etchant includes, but is not limited to, silver acid etching solution.

Specifically, the manufacturing method of the display panel 1 further includes the following steps S700-S900.

Step S700: forming a pixel definition layer 70 on the side of the passivation layer 51 away from the planar layer 52, and patterning the pixel definition layer 70 to form a first slot 70A for exposing the first electrode layer 61 and a second via hole 70B for exposing a portion of the second auxiliary electrode 61B on the pixel defining layer 70, where the second via hole 70B is communicated with the first via hole 50B. The center line W2 of the second through hole 70B, the center line W4 of the second undercut opening 610B, the center line W7 of the fourth sub-hole, the center line W6 of the third sub-hole and the center line W1 of first undercut opening 460C are overlapped with each other.

Figure 9F:
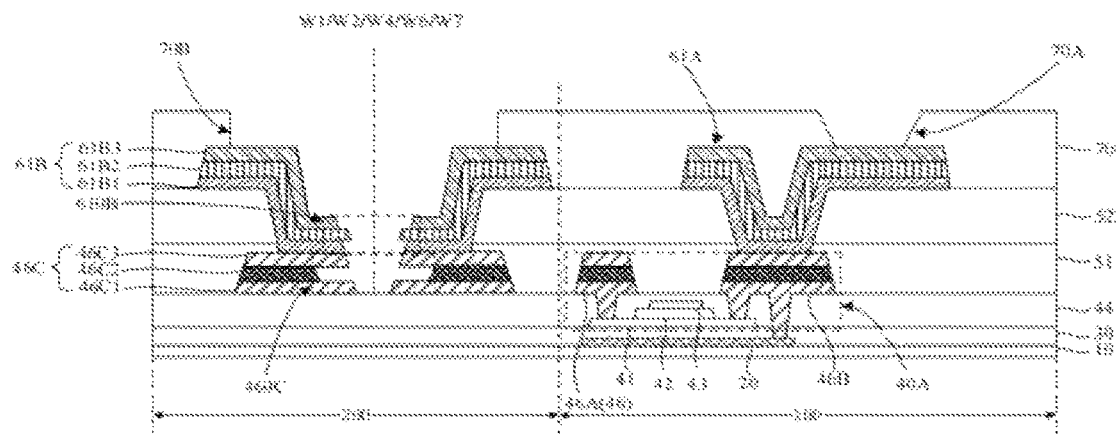
FIG. 9F is a flowchart of a structural process for manufacturing the display panel in FIG. 8.

Step S800: forming a light emitting layer 62 on the side of the first electrode layer 61 away from the pixel definition layer 70, where the light emitting layer 62 is connected to the first sub-electrode 61A through the first slot 70A, disconnected at the second undercut opening 610B, and includes a via hole 620 disposed corresponding to the second undercut opening 610B, as shown in FIG. 9F.

The light emitting layer 62 includes a second body portion 62A disposed between the first auxiliary electrode 46C and the first body portion 63A, and a branch portion 62B disposed within the first sub-undercut opening 461C, where the branch portion 62B is disconnected from the second body portion 62A, and an orthographic projection of the connection portion 63B on the substrate 10 covers an orthographic projection of the branch portion 62B on the substrate 10.

Figure 9G:
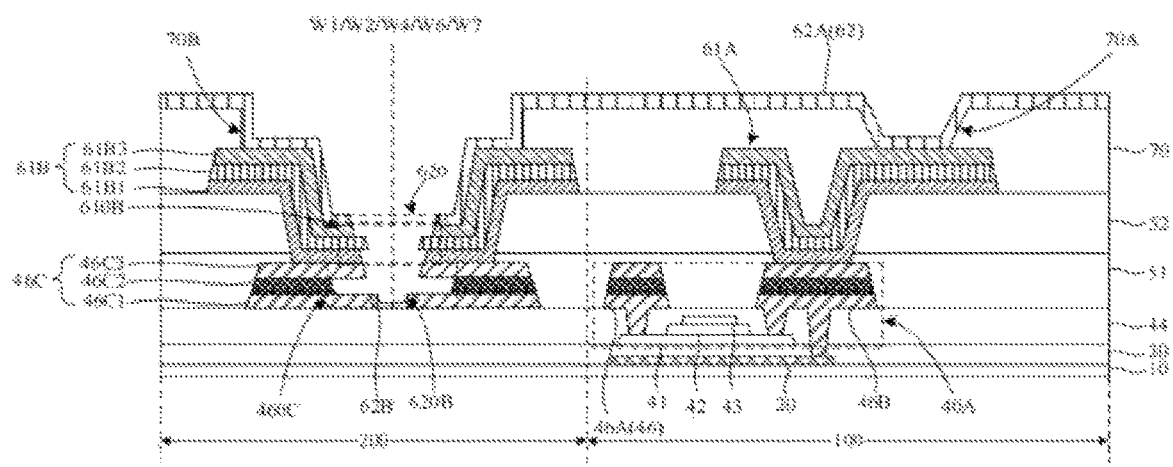
FIG. 9G is a flowchart of a structural process for manufacturing the display panel in FIG. 8.

Step S900: forming a second electrode layer 63 on the side of the light emitting layer 62 away from the first electrode layer 61, where the second electrode layer 63 is connected to the light emitting layer 62 through the first slot 70A, the second electrode layer 63 is extended from the via hole 620 into the first undercut opening 460C and connected to the second auxiliary electrode 61B, and the second electrode layer 63 is extended from the second undercut opening 610B into the first undercut opening 460C and connected to the first auxiliary electrode 46C, as shown in FIG. 9G.

It should be understood that an impedance of the second electrode layer 63 may be reduced in the present embodiment by a parallel connection of the second auxiliary electrode 61B, the first auxiliary electrode 46C, and the second electrode layer 63. As a result, a voltage drop (IR Drop) effect of the second electrode layer 63 can be further improved, which is beneficial to improve display quality of the display panel 1. Further, by using the first electrode layer 61 including the second auxiliary electrode 61B having the second undercut opening 610B, the process of additionally setting the first undercut opening is saved.

An embodiment of the present application provides a display device including the display panel according to any one of the foregoing embodiments.

It should be understood that the display panel has been described in detail in the above-mentioned embodiments, which will not be repeatedly described herein.

In specific applications, the display device can be a display screen of a device such as a smart cell phone, a tablet computer, a notebook computer, a smart band, a smart watch, smart glasses, a smart helmet, a desktop computer, a smart TV or a digital camera, etc. and may be even applied on an electronic device having a flexible display screen.

In the foregoing embodiments, descriptions of the embodiments are emphasized. A portion that is not described in detail in an embodiment may refer to related descriptions in another embodiment.

The display panel, the manufacturing method thereof, and the display device provided in the embodiments of the present application are described in detail above. A specific example is used herein to describe a principle and an implementation of the present application. The description of the foregoing embodiments is merely used to help understand a method and a core idea of the present application. In addition, a person skilled in the art may make changes in a specific implementation manner and an application scope according to an idea of the present application. In conclusion, content of this specification should not be construed as a limitation on the present application.

What is claimed is:

1. A display panel, comprising:
a substrate;
a light emitting device layer disposed on the substrate and including a first electrode layer, a light emitting layer, and a second electrode layer disposed on the substrate in a stacked manner;
a first auxiliary electrode disposed between the substrate and the light emitting layer;
wherein, the first auxiliary electrode includes a first undercut opening penetrating through the first auxiliary electrode, wherein a side edge of the first auxiliary electrode is exposed within the first undercut opening, the light emitting layer is disconnected at the first undercut opening, the second electrode layer is disposed continuously at the first undercut opening, and at least a portion of the second electrode layer is in contact with the side edge of the first auxiliary electrode;
wherein, the second electrode layer includes a first body portion disposed on a side of the first auxiliary electrode away from the substrate and a connection portion disposed within the first undercut opening; wherein the connection portion is in contact with the side edge of the first auxiliary electrode and connected to the first body portion at the side edge of the first auxiliary electrode;
wherein the first auxiliary electrode includes a first conductive layer, a second conductive layer, and a third conductive layer disposed in a stacked manner, the second conductive layer being disposed between the first conductive layer and the third conductive layer;
wherein the first undercut opening includes a first sub-undercut opening disposed in the first conductive layer, a second sub-undercut opening disposed in the second conductive layer, and a third sub-undercut opening disposed in the third conductive layer, the first sub-undercut opening, the second sub-undercut opening, and the third sub-undercut opening are communicated with each other, and a diameter of the first sub-undercut opening and a diameter of the third sub-undercut opening are both less than a diameter of the second sub-undercut opening;
wherein the light emitting layer includes a second body portion disposed between the first auxiliary electrode and the first body portion, and a branch portion disposed within the first sub-undercut opening, wherein the branch portion is disconnected from the second body portion, and an orthographic projection of the connection portion on the substrate covers an orthographic projection of the branch portion on the substrate.

2. The display panel of claim 1, wherein the branch portion is disposed within the first sub-undercut opening, and a thickness of the branch portion is less than or equal to a thickness of the first conductive layer.

3. The display panel of claim 2, wherein, within the first undercut opening, the connection portion is in contact with a side of the first conductive layer away from the substrate, the connection portion is in contact with a side edge of the second conductive layer, and the connection portion is in contact with a side edge of the third conductive layer.

4. The display panel of claim 1, wherein, the first electrode layer includes a second auxiliary electrode disposed between the first auxiliary electrode and the light emitting layer, wherein the second auxiliary electrode is connected to the first auxiliary electrode and an orthographic projection of the second auxiliary electrode on the substrate covers an orthographic projection of the first auxiliary electrode on the substrate; wherein the second auxiliary electrode includes a second undercut opening disposed corresponding to the first undercut opening, wherein the second undercut opening penetrates through the second auxiliary electrode, a side edge of the second auxiliary electrode is exposed within the second undercut opening, the light emitting layer is disconnected at the second undercut opening, the second electrode layer is continuously disposed at the second undercut opening, the second undercut opening and the first undercut opening is in communication with each other, the second electrode layer is extended from the second undercut opening into the first undercut opening, and at least a portion of the second electrode layer is in contact with the side edge of the second auxiliary electrode.

5. The display panel of claim 4, wherein the second auxiliary electrode includes a fourth conductive layer, a fifth conductive layer, and a sixth conductive layer disposed in a stacked manner, the fifth conductive layer being disposed between the fourth conductive layer and the sixth conductive layer;
wherein the first undercut opening includes a fourth sub-undercut opening disposed in the fourth conductive layer, a fifth sub-undercut opening disposed in the fifth conductive layer, and a sixth sub-undercut opening disposed in the sixth conductive layer, the fourth sub-undercut opening, the fifth sub-undercut opening, and the sixth sub-undercut opening being communicated with each other.

6. The display panel of claim 1, wherein the first auxiliary electrode includes a first conductive layer, a second conductive layer, and a third conductive layer disposed in a stacked manner, the second conductive layer being disposed between the first conductive layer and the third conductive layer;
the first conductive layer includes a first conductive sub-portion and a first extension portion, wherein the first conductive sub-portion is connected to the second conductive layer, and an orthographic projection of the first extension portion on the substrate is not overlapped with an orthographic projection of the second conductive layer on the substrate; the third conductive layer includes a second conductive sub-portion and a second extension portion, wherein the second conductive sub-portion is connected to the second conductive layer, and an orthographic projection of the second extension portion on the substrate is not overlapped with an orthographic projection of the second conductive layer on the substrate;
wherein the first undercut opening is formed by the first extension portion, a side surface of the second conductive layer, and the second extension portion.

7. A manufacturing method of a display panel, comprising the following steps:
providing a substrate;
forming a first auxiliary electrode on the substrate, and forming a first undercut opening on the first auxiliary electrode penetrating through the first auxiliary electrode, wherein a side edge of the first auxiliary electrode is exposed in the first undercut opening; and
sequentially forming a first electrode layer, a light emitting layer, and a second electrode layer on a side of the first auxiliary electrode away from the substrate; wherein the light emitting layer is disconnected at the first undercut opening, the second electrode layer is disposed continuously at the first undercut opening, and at least a portion of the second electrode layer is in contact with a side edge of the first auxiliary electrode;
wherein, the second electrode layer includes a first body portion disposed on a side of the first auxiliary electrode away from the substrate and a connection portion disposed within the first undercut opening; wherein the connection portion is in contact with the side edge of the first auxiliary electrode and connected to the first body portion at the side edge of the first auxiliary electrode;
wherein the first auxiliary electrode includes a first conductive layer, a second conductive layer, and a third conductive layer disposed in a stacked manner, the second conductive layer being disposed between the first conductive layer and the third conductive layer;
wherein the first undercut opening includes a first sub-undercut opening disposed in the first conductive layer, a second sub-undercut opening disposed in the second conductive layer, and a third sub-undercut opening disposed in the third conductive layer, the first sub-undercut opening, the second sub-undercut opening, and the third sub-undercut opening are communicated with each other, and a diameter of the first sub-undercut opening and a diameter of the third sub-undercut opening are both less than a diameter of the second sub-undercut opening;
wherein the light emitting layer includes a second body portion disposed between the first auxiliary electrode and the first body portion, and a branch portion disposed within the first sub-undercut opening, wherein the branch portion is disconnected from the second body portion, and an orthographic projection of the connection portion on the substrate covers an orthographic projection of the branch portion on the substrate.

8. A display device, comprising a display panel, wherein the display panel comprises:
a substrate;
a light emitting device layer disposed on the substrate and including a first electrode layer, a light emitting layer, and a second electrode layer disposed on the substrate in a stacked manner;
a first auxiliary electrode disposed between the substrate and the light emitting layer;
wherein, the first auxiliary electrode includes a first undercut opening penetrating through the first auxiliary electrode, wherein a side edge of the first auxiliary electrode is exposed within the first undercut opening, the light emitting layer is disconnected at the first undercut opening, the second electrode layer is disposed continuously at the first undercut opening, and at least a portion of the second electrode layer is in contact with the side edge of the first auxiliary electrode;

wherein, the second electrode layer includes a first body portion disposed on a side of the first auxiliary electrode away from the substrate and a connection portion disposed within the first undercut opening; wherein the connection portion is in contact with the side edge of the first auxiliary electrode and connected to the first body portion at the side edge of the first auxiliary electrode;

wherein the first auxiliary electrode includes a first conductive layer, a second conductive layer, and a third conductive layer disposed in a stacked manner, the second conductive layer being disposed between the first conductive layer and the third conductive layer;

wherein the first undercut opening includes a first sub-undercut opening disposed in the first conductive layer, a second sub-undercut opening disposed in the second conductive layer, and a third sub-undercut opening disposed in the third conductive layer, the first sub-undercut opening, the second sub-undercut opening, and the third sub-undercut opening are communicated with each other, and a diameter of the first sub-undercut opening and a diameter of the third sub-undercut opening are both less than a diameter of the second sub-undercut opening;

wherein the light emitting layer includes a second body portion disposed between the first auxiliary electrode and the first body portion, and a branch portion disposed within the first sub-undercut opening, wherein the branch portion is disconnected from the second body portion, and an orthographic projection of the connection portion on the substrate covers an orthographic projection of the branch portion on the substrate.

9. The display device of claim 8, wherein the branch portion is disposed within the first sub-undercut opening, and a thickness of the branch portion is less than or equal to a thickness of the first conductive layer.

10. The display panel of claim 9, wherein, within the first undercut opening, the connection portion is in contact with a side of the first conductive layer away from the substrate, the connection portion is in contact with a side edge of the second conductive layer, and the connection portion is in contact with a side edge of the third conductive layer.

11. The display device of claim 8, wherein, the first electrode layer includes a second auxiliary electrode disposed between the first auxiliary electrode and the light emitting layer, wherein the second auxiliary electrode is connected to the first auxiliary electrode and an orthographic projection of the second auxiliary electrode on the substrate covers an orthographic projection of the first auxiliary electrode on the substrate; wherein the second auxiliary electrode includes a second undercut opening disposed corresponding to the first undercut opening, wherein the second undercut opening penetrates through the second auxiliary electrode, a side edge of the second auxiliary electrode is exposed within the second undercut opening, the light emitting layer is disconnected at the second undercut opening, the second electrode layer is continuously disposed at the second undercut opening, the second undercut opening and the first undercut opening is in communication with each other, the second electrode layer is extended from the second undercut opening into the first undercut opening, and at least a portion of the second electrode layer is in contact with the side edge of the second auxiliary electrode.

12. The display device of claim 11, wherein the second auxiliary electrode includes a fourth conductive layer, a fifth conductive layer, and a sixth conductive layer disposed in a stacked manner, the fifth conductive layer being disposed between the fourth conductive layer and the sixth conductive layer;

wherein the first undercut opening includes a fourth sub-undercut opening disposed in the fourth conductive layer, a fifth sub-undercut opening disposed in the fifth conductive layer, and a sixth sub-undercut opening disposed in the sixth conductive layer, the fourth sub-undercut opening, the fifth sub-undercut opening, and the sixth sub-undercut opening being communicated with each other.

13. The display device of claim 8, wherein the first auxiliary electrode includes a first conductive layer, a second conductive layer, and a third conductive layer disposed in a stacked manner, the second conductive layer being disposed between the first conductive layer and the third conductive layer;

the first conductive layer includes a first conductive sub-portion and a first extension portion, wherein the first conductive sub-portion is connected to the second conductive layer, and an orthographic projection of the first extension portion on the substrate is not overlapped with an orthographic projection of the second conductive layer on the substrate; the third conductive layer includes a second conductive sub-portion and a second extension portion, wherein the second conductive sub-portion is connected to the second conductive layer, and an orthographic projection of the second extension portion on the substrate is not overlapped with an orthographic projection of the second conductive layer on the substrate;

wherein the first undercut opening is formed by the first extension portion, a side surface of the second conductive layer, and the second extension portion.

* * * * *